(12) United States Patent
Otaki et al.

(10) Patent No.: US 8,987,895 B2
(45) Date of Patent: Mar. 24, 2015

(54) CLAD MATERIAL FOR INSULATING SUBSTRATES

(75) Inventors: Atsushi Otaki, Oyama (JP); Shigeru Oyama, Oyama (JP)

(73) Assignee: Showa Denko K.K., Tokyo (JP)

( * ) Notice: Subject to any disclaimer, the term of this patent is extended or adjusted under 35 U.S.C. 154(b) by 83 days.

(21) Appl. No.: 13/883,800

(22) PCT Filed: Oct. 25, 2011

(86) PCT No.: PCT/JP2011/074519
§ 371 (c)(1),
(2), (4) Date: Jul. 25, 2013

(87) PCT Pub. No.: WO2012/063638
PCT Pub. Date: May 18, 2012

(65) Prior Publication Data
US 2013/0292816 A1 Nov. 7, 2013

(30) Foreign Application Priority Data

Nov. 8, 2010 (JP) .................. 2010-249561

(51) Int. Cl.
*H01L 23/34* (2006.01)
*H01L 23/373* (2006.01)
*B32B 15/01* (2006.01)
*B23K 1/00* (2006.01)

(52) U.S. Cl.
CPC ............ *H01L 23/3735* (2013.01); *B32B 15/01* (2013.01); *B23K 1/0016* (2013.01); *B32B 15/017* (2013.01); *B23K 2201/40* (2013.01); *H01L 2924/0002* (2013.01)
USPC .... 257/717; 257/712; 257/720; 257/E23.106; 257/E23.109

(58) Field of Classification Search
USPC .................. 257/706, 712, 717, 720, E23.106, 257/E23.109
See application file for complete search history.

(56) References Cited

U.S. PATENT DOCUMENTS

| | | | |
|---|---|---|---|
| 2002/0089828 A1* | 7/2002 | Suzuki et al. ................. | 361/709 |
| 2006/0051898 A1* | 3/2006 | Lu et al. ........................ | 438/121 |
| 2007/0231967 A1* | 10/2007 | Jadhav et al. ................ | 438/122 |
| 2011/0240279 A1* | 10/2011 | Furman et al. ................ | 165/185 |

FOREIGN PATENT DOCUMENTS

| | | |
|---|---|---|
| JP | 03-252382 A | 11/1991 |
| JP | 2002-203932 A | 7/2002 |
| JP | 2004-235503 A | 8/2004 |
| JP | 2004-328012 A | 11/2004 |
| JP | 2006-303346 A | 11/2006 |
| JP | 2009-147123 A | 7/2009 |

OTHER PUBLICATIONS

Official Communication issued in International Patent Application No. PCT/JP2011/074519, mailed on Jan. 31, 2012.

* cited by examiner

*Primary Examiner* — Matthew E Warren
(74) *Attorney, Agent, or Firm* — Keating & Bennett, LLP

(57) ABSTRACT

A clad material 1A for insulating substrates is provided with a Ni layer 4 made of Ni or a Ni alloy, a Ti layer 6 made of Ti or a Ti alloy and arranged on one side of the Ni layer, and a first Al layer 7 made of Al or an Al alloy and arranged on one side of the Ti layer 6 that is opposite to a side of the Ti layer 6 on which the Ni layer 4 is arranged. The Ni layer 4 and the Ti layer 6 are joined by clad rolling. A Ni—Ti series superelastic alloy layer 5 formed by alloying at least Ni of constituent elements of the Ni layer 4 and at least Ti of constituent elements of the Ti layer 6 is interposed between the Ni layer 4 and the Ti layer 6. The Ti layer 6 and the first Al layer 7 are joined by clad rolling in an adjoining manner.

18 Claims, 6 Drawing Sheets

US 8,987,895 B2

CLAD MATERIAL FOR INSULATING SUBSTRATES

TECHNICAL FIELD

The present invention relates to a clad material for insulating substrates used for heat dissipation of semiconductor elements, a production method thereof, a semiconductor module base, and a semiconductor module.

In this specification, the term "plate" is used to include a meaning of "foil."

TECHNICAL BACKGROUND

A semiconductor module such as a power semiconductor module is equipped with a heat dissipation member (for example, a heat sink, a cooler) to release heat generated from a semiconductor element during its operation. In such a semiconductor module, a heat dissipation insulating substrate for transmitting the heat generated by the semiconductor element to the heat dissipation member is arranged between the semiconductor element and the heat dissipation member. The insulating substrate functions as a thermal conductor and also functions as an electrical insulator. Specifically, the insulating substrate includes a ceramic layer as an electrical insulating layer and a metal layer including a wiring layer (circuit layer) joined to one of surfaces of the ceramic layer (see, e.g., Patent Documents to 4). A semiconductor element is joined to the metal layer of the insulating substrate by soldering.

In the recent years, an Al layer made of Al or an Al alloy is used as a wiring layer because of the following reasons. That is, an Al layer is excellent in electrical characteristics and thermal characteristics, and is capable of reducing the production cost of the insulating substrate.

An Al layer, however, is poor in soldering joinability. Therefore, in cases where the wiring layer is an Al layer, in order to make it possible for a semiconductor element to be joined to the insulating substrate by soldering, for example, a Ni plated layer as a Ni layer is formed on the metal layer of the insulating substrate.

When the Ni layer, such as, e.g., a Ni plated layer, formed on the metal layer of the insulating substrate is about a few pm in thickness, there were following drawbacks. The heat applied during brazing of the insulating substrate and the heat dissipation member and the heat applied during soldering of the semiconductor element and the insulating substrate caused large irregularities on a surface of the Ni layer. This essentially prevented implementation of the semiconductor element to the insulating substrate. For this reason, it is preferable that the Ni layer is relatively thick. More specifically, it is especially preferable that the Ni layer is 15 µm or more in thickness.

PRIOR ARTS

Patent Documents

Patent Document 1: Japanese Unexamined Laid-open Patent Application Publication No. 2004-328012
Patent Document 2: Japanese Unexamined Laid-open Patent Application Publication No. 2004-235503
Patent Document 3: Japanese Unexamined Laid-open Patent Application Publication No. 2006-303346
Patent Document 4: Japanese Unexamined Laid-open Patent Application Publication No. 2009-147123

SUMMARY OF THE INVENTION

Problems to be Solved by the Invention

In a semiconductor module, as a semiconductor element is operated, the temperature of the semiconductor element raises from room temperature to 150 to 300° C. Therefore, every time the semiconductor element is operated, temperature changes occur in the insulating substrate from room temperature to the operation temperature of the semiconductor element. The temperature changes and repetitions thereof (that is, cooling/heating cycles) cause thermal stress in the insulating substrate due to the differences in thermal expansion among layers constituting the insulating substrate. The thermal stress sometimes caused defects, such as, e.g., warping of the insulating substrate, cracking and/or detachment of bonded interfaces of the insulating substrate. The aforementioned defects are especially likely to occur when the Ni layer is thick.

Furthermore, when a Ni layer and an Al layer are joined in an adjoining manner, an alloy layer low in intensity is formed between the Ni layer and the Al layer (i.e., the bonded interface of the Ni layer and the Al layer). Defects, such as, e.g., cracks and detachments, are likely to occur at the alloy layer.

The present invention was made in view of the aforementioned technical background, and aims to provide a clad material for insulating substrates as described above, which is excellent in soldering joinability and capable of preventing occurrence of defects such as cracking and detachments of the bonded interface, its production method, a semiconductor module base, and a semiconductor module.

Means to Solve the Problems

The present invention provides the following means.
[1] A clad material for insulating substrates, comprising:
a Ni layer made of Ni or a Ni alloy, the Ni layer having a surface on which a semiconductor element is to be joined;
a Ti layer made of Ti or a Ti alloy and arranged on one side of the Ni layer, the Ti layer and the Ni layer being joined by clad rolling;
a Ni—Ti series superelastic alloy layer interposed between the Ni layer and the Ti layer, the Ni—Ti series superelastic alloy layer being formed by alloying at least Ni of constituent elements of the Ni layer and at least Ti of constituent elements of the Ti layer; and
a first Al layer made of Al or an Al alloy and arranged on one side of the Ti layer that is opposite to a side of the Ti layer on which the Ni layer is arranged, the first Al layer and the Ti layer being joined by clad rolling in an adjoining manner.
[2] The clad material for insulating substrate as recited in Item 1,
wherein the Ti layer and the first Al layer are joined by cold or warm clad rolling after joining the Ni layer and the Ti layer by warm or hot clad rolling.
[3] The clad material for insulating substrates as recited in Item 1 or 2, wherein the first Al layer and a brazing layer arranged on one side of the first Al layer that is opposite to a side of the first Al layer on which the Ti layer is arranged are joined by clad rolling.
[4] The clad material for insulating substrates as recited in any one of Items 1 to 3,
wherein the first Al layer is made of Al having a purity of 99.99 mass % or higher.

[5] An insulating substrate comprising:
a ceramic layer;
a first metal layer arranged on one side of the ceramic layer; and
a second metal layer arranged on the other side of the ceramic layer that is opposite to the one side of the ceramic layer on which the first metal layer is arranged,
wherein the first metal layer and the ceramic layer are joined,
wherein the ceramic layer and the second metal layer are joined, and
wherein the first metal layer contains the clad material as recited in any one of Items 1 to 3.
[6] The insulating substrate as recited in Item 5,
wherein the first Al layer of the clad material is made of Al having a purity of 99.99 mass% or higher, and
wherein the first Al layer and the ceramic layer are joined by brazing in an adjoining manner.
[7] The insulating substrate as recited in Item 5,
wherein the first metal layer further comprises a second Al layer made of Al or an Al alloy,
wherein the first Al layer of the clad material and the second Al layer are joined by brazing in an adjoining manner, and
wherein the second Al layer and the ceramic layer are joined by brazing in an adjoining manner.
[8] The insulating substrate as recited in Item 7,
wherein the first Al layer is made of Al having a purity of less than 99.99 mass % or an Al alloy, and
wherein the second Al layer is made of Al having a purity of 99.99 mass % or higher.
[9] The insulating substrate as recited in Item 8,
wherein the second Al layer is thicker than the first Al layer.
[10] The insulating substrate as recited in any one of Items 5 to 9,
wherein the second metal layer includes a third Al layer made of Al or an Al alloy, and
wherein the ceramic layer and the third Al layer are joined by brazing.
[11] A production method of a clad material for insulating substrates, comprising:
a first joining step of joining a Ni layer made of Ni or a Ni alloy and having a surface on which a semiconductor element is to be joined and a Ti layer made of Ti or a Ti alloy and arranged on one side of the Ni layer by clad rolling, to thereby form a Ni—Ti series superelastic alloy layer between the Ni layer and the Ti layer by alloying at least Ni of constituent elements of the Ni layer and at least Ti of constituent elements of the Ti layer; and
a second joining step of joining the Ti layer and a first Al layer made of Al or an Al alloy and arranged on one side of the Ti layer that is opposite to a side of the Ti layer on which the Ni layer is arranged by clad rolling in an adjoining manner.
[12] The production method of a clad material for insulating substrates as recited in Item 11, wherein
in the first joining step, the Ni layer and the Ti layer are joined by warm or hot clad rolling, and in the second joining step, after the first joining step, the Ti layer and the first Al layer are joined by cold or warm clad rolling.
[13] The production method of a clad material for insulating substrates as recited in Item 11 or 12, further comprising a third joining step of joining the first Al layer and a brazing layer arranged on one side of the first Al layer that is opposite to a side of the first Al layer on which the Ti layer is arranged by clad rolling.

[14] The production method of a clad material for insulating substrates as recited in any one of Items 11 to 13,
wherein the first Al layer is made of Al having a purity of 99.99 mass% or higher.
[15] A production method of an insulating substrate including a ceramic layer, a first metal layer arranged on one side of the ceramic layer, and a second metal layer arranged on the other side of the ceramic layer that is opposite to the one side of the ceramic layer on which the first metal layer is arranged, the production method comprising:
a fourth joining step of joining the first metal layer and the ceramic layer; and
a fifth joining step of joining the ceramic layer and the second metal layer,
wherein the first metal layer includes the clad material as recited in any one of Items 1 to 3.
[16] The production method of an insulating substrate as recited in Item 15,
wherein the first Al layer of the clad material of the first metal layer is made of Al having a purity of 99.99 mass % or higher, and
wherein at the fourth joining step, the first Al layer and the ceramic layer are joined by brazing in an adjoining manner.
[17] The production method of an insulating substrate as recited in Item 15,
wherein the first metal layer further includes a second Al layer made of Al or an Al alloy, and
wherein in the fourth joining step, the first Al layer of the clad material and the second Al layer are joined by brazing in an adjoining manner, and the second Al layer and the ceramic layer are joined by brazing in an adjoining manner.
[18] The production method of an insulating substrate as recited in Item 17,
wherein the first Al layer is made of Al having a purity of less than 99.99 mass % or an Al alloy, and
wherein the second Al layer is made of Al having a purity of 99.99 mass % or higher.
[19] The production method of an insulating substrate as recited in Item 18,
wherein the second Al layer is thicker than the first Al layer.
[20] The production method of an insulating substrate as recited in any one of Items 15 to 19,
wherein the second metal layer contains a third Al layer made of Al or an Al alloy, and
wherein the ceramic layer and the third Al layer are joined by brazing.
[21] A base for a semiconductor module, comprising:
the insulating substrate as recited in any one of Items 5 to 10; and
a heat dissipation member arranged on one side of the insulating substrate which is opposite to a side of the second metal layer of the insulating substrate on which the ceramic layer is arranged,
wherein the second metal layer and the heat dissipation member are joined.
[22] A semiconductor module comprising:
the insulating substrate as recited in any one of Items 5 to 10;
a heat dissipation member arranged on one side of the insulating substrate that is opposite to a side of the second metal layer of the insulating substrate on which the ceramic layer is arranged; and
a semiconductor element,
wherein the semiconductor element is joined to a surface of the Ni layer of the insulating substrate by soldering, and wherein the second metal layer and the heat dissipation member are joined.

Effect of the Invention

The present invention exerts the following effects.

In the clad material for insulating substrates as recited in the aforementioned Item [1], the Ni layer and the Ti layer are joined by clad rolling, and the Ni—Ti series superelastic alloy layer is interposed between the Ni layer and the Ti layer. Therefore, in cases where the clad material is used as an insulating substrate, thermal stress generated in the insulating substrate by cooling/heating cycles is eased by the Ni—Ti series superelastic alloy layer.

Even if a Ni layer and a Ti layer are joined, not by clad rolling, but by brazing, no superelastic alloy layer will be formed between the Ni layer and the Ti layer.

Furthermore, since the Ni layer and the first Al layer are not joined in an adjoining manner, an alloy layer poor in intensity will not be formed in the clad material.

Furthermore, if the Ti layer and the first Al layer are joined by brazing in an adjoining manner, an alloy layer poor in intensity (example: an Al—Ti alloy layer) will be formed between the Ti layer and the first Al layer (that is, the bonded interface of the Ti layer and the first Al layer) by the brazing heat. However, in the clad material as recited in the aforementioned Item [1], the Ti layer and the first Al layer are joined, not by brazing, but by clad rolling capable of joining the layers at a lower temperature than a brazing temperature. This prevents formation of an alloy layer poor in intensity between the Ti layer and the first Al layer.

As mentioned above, the Ni—Ti series superelastic alloy layer is interposed between the Ni layer and the Ti layer. The Ni layer and the first Al layer are not joined in an adjoining manner. The Ti layer and the first Al layer are joined by clad rolling. These act on each other synergistically, which prevents occurrence of defects, such as, e.g., warping of the insulating substrate, cracking or detachment of the bonded interface of the insulating substrate, etc. This enhances the dimensional accuracy and/or service life of the insulating substrate. Furthermore, the clad material includes the Ni layer, so the soldering joinability is excellent. Furthermore, since the clad material includes the first Al layer, it is excellent in electrical and thermal characteristics, and the production cost can be reduced.

According to the clad material as recited in the aforementioned Item [2], since the Ti layer and the first Al layer are joined by cold or warm clad rolling after joining the Ni layer and the Ti layer by warm or hot clad rolling, the following effects are exerted.

If the Ni layer and the Ti layer are joined by warm or hot clad rolling after joining the Ti layer and the first Al layer by cold or warm clad rolling, an alloy layer poor in intensity (example: Al—Ti alloy layer) will be formed between the Ti layer and the first Al layer by the heat generated at the time of joining the Ni layer and the Ti layer. On the other hand, when the Ti layer and the first Al layer are joined by cold or warm clad rolling after joining the Ni layer and the Ti layer by warm or hot clad rolling, formation of an alloy layer poor in intensity between the Ti layer and the first Al layer can be assuredly prevented.

In the clad material as recited in the aforementioned Item [3], since the first Al layer and the brazing layer are joined by clad rolling, the brazing layer can be used as a brazing material when joining the clad material and the other layers of the insulating substrate by brazing. Therefore, the clad material and other layers of the insulating substrate can be easily joined.

In the clad material as recited in the aforementioned Item [4], since the first Al layer is made of Al having a purity of 99.99 mass % or higher, the first Al layer can be suitably used as a wiring layer of insulating substrates.

In the insulating substrate as recited in the aforementioned Item [5], since the first metal layer and the ceramic layer are joined and that the first metal layer contains the clad material as recited in any one of the aforementioned Items [1] to [3], an insulating substrate that can exert the aforementioned effects by a clad material can be provided.

In the insulating substrate as recited in the aforementioned Item [6], since the first Al layer of the clad material is made of Al having a purity of 99.99 mass % or higher, the first Al layer can be suitably used as a wiring layer of the insulating substrate.

In the insulating substrate as recited in the aforementioned Item [7], the first Al layer of the clad material and the second Al layer are joined by brazing in an adjoining manner. Therefore, the first Al layer can be set to have a thickness capable of easily joining the first Al layer to the Ti layer by clad rolling. Furthermore, the second Al layer can be set to have a thickness which suitably functions as a wiring layer.

In the insulating substrate of the aforementioned Item [8], since the first Al layer is made of Al having a purity of less than 99.99 mass % or an Al alloy, the first Al layer is harder than the Al layer made of Al having a purity of 99.99 mass % or higher. Therefore, the first Al layer can be easily joined to the Ti layer by clad rolling. Furthermore, since the second Al layer is made of Al having a purity of 99.99 mass % or higher, the second Al layer can be suitably used as a wiring layer for insulating substrates.

In the insulating substrate of the aforementioned Item [9], the second Al layer is thicker than the first Al layer. Therefore, the second Al layer can be suitably used as a wiring layer for insulating substrates. Furthermore, the thickness of the first Al layer can be set to be thin, which enables the first Al layer to be more easily joined to the Ti layer by clad rolling.

In the insulating substrate of the aforementioned Item [10], the second metal layer includes the third Al layer made of Al or an Al alloy. Therefore, the insulating substrate is excellent in heat releasing characteristics, and the production cost can be reduced.

In the production method of the clad material for insulating substrates as recited in the aforementioned Items [11] to [14], the clad material as recited in each of the aforementioned Items [1] to [4] can be assuredly produced.

According to the production method of a clad material for insulating substrates as recited in the aforementioned Items [15] to [20], the insulating substrate as recited in each of the aforementioned Items [5] to [10] can be assuredly produced.

According to the semiconductor module base as recited in the aforementioned Item [21], the dimensional accuracy and service life of the base can be improved. Furthermore, the base is excellent in electric and thermal characteristics, and the production cost can be reduced.

According to the semiconductor module as recited in the aforementioned Item [22], the dimensional accuracy and service life of the semiconductor module can be improved.

PREFERRED EMBODIMENTS FOR CARRYING OUT THE INVENTION

Next, some embodiments of the present invention will be explained with reference to the drawings.

In the following explanation, the wordings of "upper(above)" and "lower(below)" denote directions toward the top and bottom portions in each drawing, respectively. Also, the same symbols are allotted to the same members through all drawings.

Figure 1:
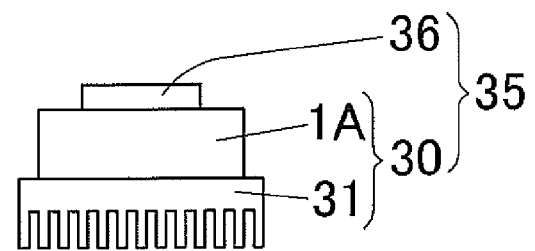
FIG. 1 is a front view showing a semiconductor module equipped with an insulating substrate according to a first embodiment of the present invention.

In FIG. 1, "35" denotes a semiconductor module equipped with an insulating substrate 1A according to a first embodiment of the present invention.

The semiconductor module 35, such as, e.g., an IGBT module, a MOSFET module, a thyristor module, and a diode module, includes a semiconductor module base 30 and a semiconductor element 36 mounted on the base 30. The semiconductor element 36 is, for example, an IGBT chip, a MOSFET chip, a thyristor chip, or a diode chip.

The semiconductor module base 30 includes the insulating substrate 1A of the first embodiment and a heat dissipation member 31.

The heat dissipation member 31 is, for example, an air-cooling type or a water-cooling type heat sink or cooler made of metal, e.g., Al or an Al alloy.

The insulating substrate 1A is approximately rectangular in plan view and arranged between the semiconductor element 36 and the heat dissipation member 31. The insulating substrate 1A is configured to transmit the heat generated by the semiconductor element 36 during the operation thereof to the heat dissipation member 31. Specifically, the insulating substrate 1A is a thermal conductor having a characteristic which functions as an electrical insulator.

Figure 2:
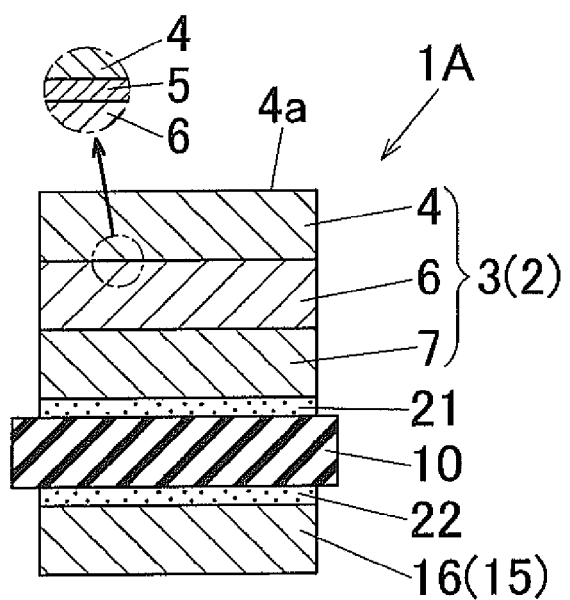
FIG. 2 is a schematic cross-sectional view of the insulating substrate.

As shown in FIG. 2, the insulating substrate 1A includes a ceramic layer 10, a first metal layer 2, and a second metal layer 15, which are arranged horizontally.

The first metal layer 2 is arranged on one side (upper side) of the ceramic layer 10. The second metal layer 15 is arranged on one side (lower side) of the ceramic layer 10 that is opposite to a side of the ceramic layer 10 on which the first metal layer 2 is arranged. Also, these layers 2, 10, and 15 are integrally joined in a laminated manner to constitute the insulating substrate 1A.

The ceramic layer 10 functions as an electric insulation layer, and is made of one or more types of ceramics selected from the group consisting of AlN, $Al_2O_3$, $Si_3N_4$, $Y_2O_3$, CaO, BN, and BeO. The ceramic layer 10 is a layer made of a ceramic plate. The thickness of the ceramic layer is, e.g., 300 to 700 µm. The melting point and decomposition point of the ceramic forming the ceramic layer 10 is, AlN: 2,200° C.; $Al_2O_3$: 2,050° C.; $Si_3N_4$: 1,900° C.; $Y_2O_3$: 2,400° C.; CaO: 2,570° C.; BN: 3,000° C.; and BeO: 2,570° C. The melting points and decomposition points are markedly higher than the melting points of the first metal layer 2 and the second metal layer 15.

The first metal layer 2 includes a clad material 3.

The second metal layer 15 includes an Al layer 16 made of Al or an Al alloy. The Al layer 16 will be referred to as a "third Al layer 16" for the convenience of explanation. The third Al layer 16 is a layer made of Al or an Al plate. The thickness of the third Al layer 16 is, e.g., 500 to 2,000 µm. In this embodiment, the second metal layer 15 is constituted only by the third Al layer 16.

The clad material 3 includes a Ni layer 4 made of Ni or a Ni alloy, a Ti layer 6 made of Ti or a Ti alloy, and an Al layer 7 made of Al or an Al alloy. This Al layer 7 will be referred to as a "first Al layer 7" for the convenience of explanation. Each layer 4, 6, and 7 is rectangular in plan view. The Ni layer 4 is a layer made of a Ni or Ni alloy plate, the Ti layer 6 is made of a Ti or Ti alloy plate, and the first Al layer 7 is made of an Al or Al alloy plate. These layers 4, 6, and 7 are integrally joined in a laminated manner to constitute the clad material 3.

The Ni layer 4 has a surface (upper surface) 4a to which the semiconductor element 36 is to be joined by soldering.

The Ti layer 6 is arranged on one side (lower side) of the Ni layer 4 that is opposite to a side of the surface 4a of the Ni layer 4. The Ti layer 6 has a role of creating a Ni—Ti series superelastic alloy layer 5 by alloying at least Ni of constituent elements of the Ni layer 4 and at least Ti of constituent elements of the Ti layer 6. The Ni layer 4 and the Ti layer 6 are joined by clad rolling.

As shown in the enlarged view showing the circular region surrounded by the two-dot chain line shown in FIG. 2, a Ni—Ti series superelastic alloy layer 5 is interposed between the Ni layer 4 and the Ti layer 6 (that is, the bonded interface of the Ni layer 4 and the Ti layer 6). The superelastic alloy layer 5 is made of a Ni—Ti series superelastic alloy created by alloying at least Ni of constituent elements of the Ni layer 4 and at least Ti of constituent elements of the Ti layer 6. In this embodiment, specifically, the Ni—Ti series superelastic alloy layer 5 is, e.g., a NiTi superelastic alloy layer.

It is preferable that the superelastic alloy of the superelastic alloy layer 5 has superelastic characteristics at a temperature range from room temperature to the operational temperature of the semiconductor element 26 (example: 300° C.), more preferably has superelastic characteristics at a temperature range from room temperature to the joining temperature of the insulating substrate 1A and the heat dissipation member 31 (example: 600° C.).

The Ni layer 4, the Ti layer 6, and the Ni—Ti series superelastic alloy layer 5 are not especially limited in thickness. However, the thermal conductivity of the Ni is 90.7 W/m·K, and the thermal conductivity of the Ti is 21.9 W/m·K, and the thermal conductivity of the Ni—Ti series superelestic alloy is 20.0 W/m·K. These thermal conductivities are significantly lower than the thermal conductivity 23.6 W/m·K of Al. For this reason, it is more preferable that the Ni layer 4, the Ti layer 6, and the Ni—Ti series superelastic alloy layer 5 are as thinner as possible to improve the thermal conductivity of the insulating substrate 1A. Therefore, it is especially preferable that the upper limit of the thickness of the Ni layer 4 is 200 µm, the upper limit of the thickness of the Ti layer 6 is 200 µm, and the upper limit of the thickness of the Ni—Ti series superelastic alloy layer 5 is 50 µm. On the other hand, if the layers 4, 6 and 5 are too thin, the desired characteristics of each layer do not develop. Therefore, it is especially preferable that the lower limit of the thickness of the Ni layer 4 is 5 µm, the lower limit of the thickness of the Ti layer 6 is 5 µm, and the lower limit of the thickness of the Ni—Ti series superelastic alloy layer 5 is 0.05 µm.

The first Al layer 7 is arranged on one side (lower side) of the Ti layer 6 that is opposite to a side of the Ti layer 6 on which the Ni layer 4 is arranged. In the first embodiment, the first Al layer 7 functions as a wiring layer of the insulating substrate 1A and therefore, it is preferred to be made of Al having a purity of 99.99 mass % or higher. Also, the Ti layer 6 and the first Al layer 7 are joined in an adjoining manner by clad rolling. The thickness of the first Al layer 7 is not especially limited. However, it is preferred that the thickness of the first Al layer 7 is set within the range of 100 to 1,000 µm so that the first Al layer 7 can assuredly function as a wiring layer of the insulating substrate 1A.

In the insulating substrate 1A of the first embodiment, the clad material 3 (specifically, the first Al layer 7 of the clad material 3) and the ceramic layer 10 are joined by brazing in an adjoining manner. In FIG. 2, the reference numeral "21" denotes a brazing layer by which the clad material 3 and the ceramic layer 10 are joined. The brazing layer 21 is preferred to be an Al series brazing layer (example: Al—Si series alloy brazing material). The ceramic layer 10 and the third Al layer 16 are joined by brazing, soldering, and resin adhesive agent. In this embodiment, the ceramic layer 10 and the third Al layer 16 are joined by brazing. The reference numeral "22" denotes a brazing layer by which the ceramic layer 10 and the third Al layer 16 are joined. The brazing layer 22 is preferred to be an Al series brazing layer (example: Al—Si series alloy brazing material).

In the drawing, each of the brazing layers 21 and 22 is shown by dots to make them easier to be differentiated from other layers.

Next, a production method of the insulating substrate 1A of the first embodiment will be explained with reference to FIG. 3.

Figure 4:
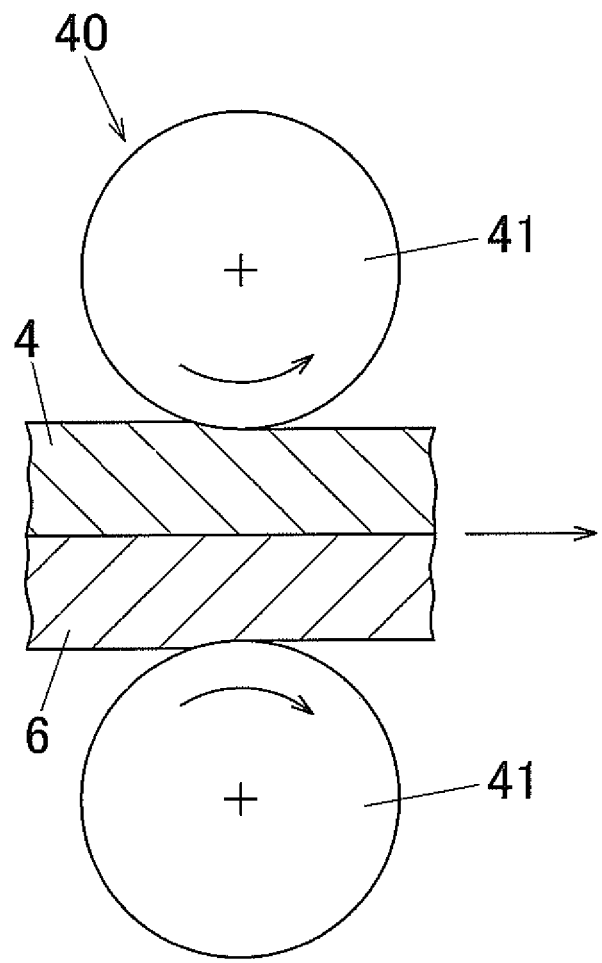
FIG. 4 is a schematic cross-sectional view showing a first joining step of joining a Ni layer and a Ti layer by clad rolling.

First, the Ni layer 4 and the Ti layer 6 are joined by clad rolling in an adjoining manner to form a Ni—Ti series superelastic alloy layer 5 created by alloying at least Ni of constituent elements of the Ni layer 4 and at least Ti of constituent elements of the Ti layer 6 between the Ni layer 4 and the Ti layer 6. In other words, the Ni layer 4 and the Ti layer 6 arranged in an adjoining manner are joined by clad rolling so that a Ni—Ti series superelastic alloy layer 5 created by alloying at least Ni of constituent elements of the Ni layer 4 and at least Ti of constituent elements of the Ti layer 6 is formed between the Ni layer 4 and the Ti layer 6. This step will be referred to as a "first joining step". In the first joining step, it is preferred that the Ni layer 4 and the Ti layer 6 are joined by warm or hot clad rolling so that the superleastic alloy layer 5 is assuredly formed between both the layers 4 and 6. In other words, as shown in FIG. 4, using a clad rolling mill 40 equipped with a pair of reduction rolls 41 and 41 arranged parallel to one another, the Ni layer 4 and the Ti layer 6 are joined (cladded) by putting the Ni layer 4 and the Ti layer 6 arranged on one another between both reduction rolls 41 and 41 to compress the Ni layer 4 and the Ti layer 6 with both the reduction rolls 41 and 41. At the time of this joining step, at least Ni of constituent elements of the Ni layer 4 and at least Ti of constituent elements of the Ti layer 6 are alloyed by the joining heat of the Ni layer 4 and the Ti layer 6, and a Ni—Ti series superelastic alloy layer 5 is formed. As a result, a Ni—Ti series superelastic alloy layer 5 is interposed between the Ni layer 4 and the Ti layer 6 (that is, at the bonded interface of the Ni layer 4 and the Ti layer 6).

The joining conditions of the first joining step are not especially limited, and can be any conditions in which the Ni layer 4 and the Ti layer 6 can be joined by clad rolling so that a Ni—Ti series superelastic alloy layer 5 is formed between both layers 4 and 6. For example, the joining conditions can be a clad temperature of 630 to 750° C. and a cladding rate of 40 to 60%.

Thereafter, the Ti layer 6 and the first Al layer 7 are joined by clad rolling in an adjoining manner. This step is referred to as a "second joining step".

In the second joining step, using the clad rolling mill 40 as shown in FIG. 4, the Ti layer 6 and the first Al layer 7 are joined by cold or warm clad rolling at a clad temperature lower than the clad temperature at which the Ni layer 4 and the Ti layer 6 were joined.

The joining conditions of the second joining step are not especially limited, and can be any conditions in which the Ti layer 6 and the first Al layer 7 can be joined by clad rolling. For example, the joining conditions can be a clad temperature of 350 to 430° C. and a cladding rate of 30 to 60%.

By sequentially performing the first joining step and the second joining step in the aforementioned manner, the clad material 3 of the first embodiment can be obtained.

Figure 3:
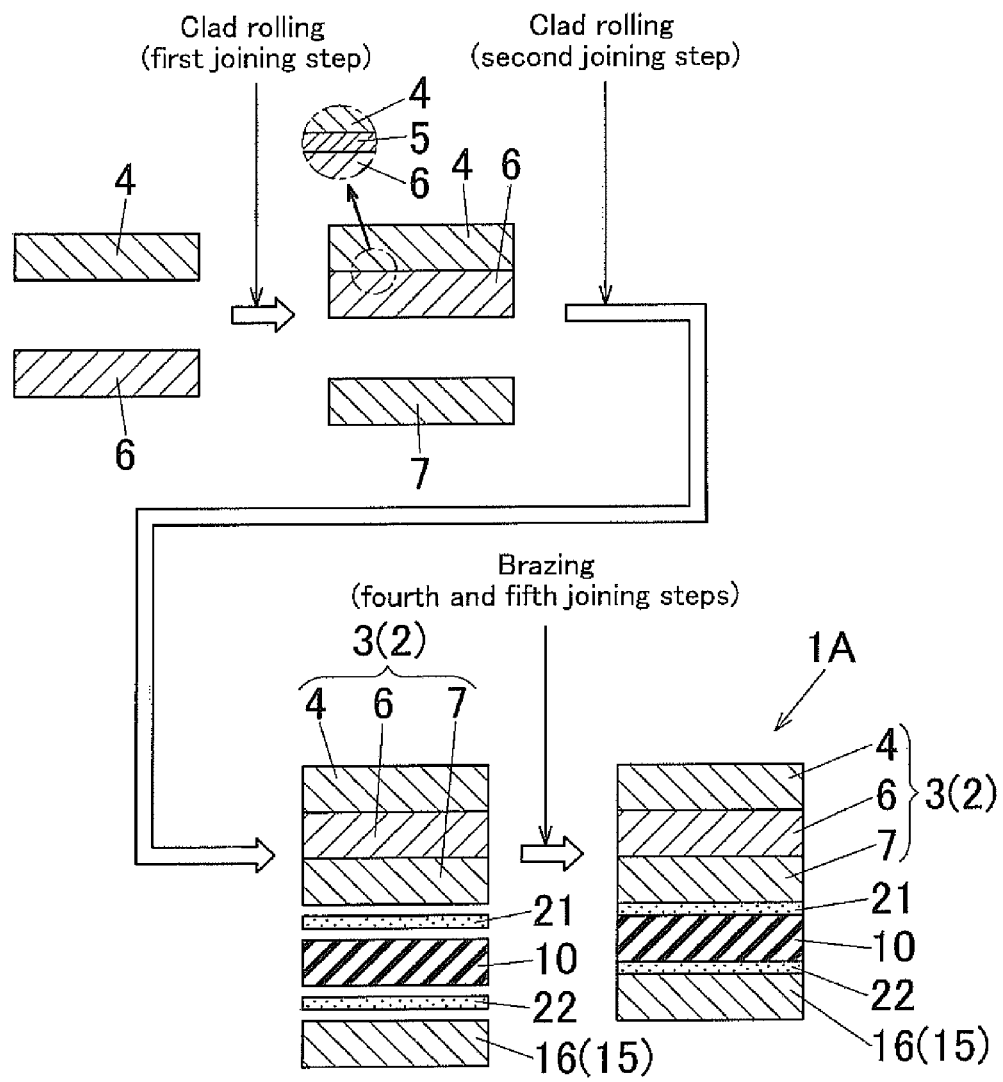
FIG. 3 is a schematic cross-sectional view showing the production steps of the insulating substrate.

Next, in order to produce the insulating substrate 1A using the clad material 3, the clad material 3 and the ceramic layer 10 are joined as shown in FIG. 3. The step will be referred to as a "fourth joining step" for the convenience of explanation. Furthermore, the ceramic layer 10 and the third Al layer 16 are joined. This step will be referred to as a "fifth joining step" for the convenience of explanation.

In the fourth joining step, the clad material 3 and the ceramic layer 10 are joined by brazing, for example. In the same way, in the fifth joining step, the ceramic layer 10 and the third Al layer 16 are joined by brazing, for example.

The order of performing the fourth joining step and the fifth joining step is not especially limited. For example, the fifth joining step can be performed after the fourth joining step. The fourth joining step can be performed after the fifth joining step. Further, the fourth joining step and the fifth joining step can be performed simultaneously.

When simultaneously performing the fourth joining step and the fifth joining step, a plate-like Al series brazing material (thickness: e.g., 10 to 60 µm) as a brazing layer 21 is arranged between the clad material 3 (specifically, the first Al layer 7 of the clad material 3) and the ceramic layer 10, and a plate-like Al series brazing material (thickness: e.g., 10 to 60 µm) as a brazing layer 22 is arranged between the ceramic layer 10 and the third Al layer 16. The clad material 3, the ceramic layer 10, and the third Al layer 16 are collectively and simultaneously joined by, e.g., furnace brazing.

The insulating substrate 1A of the first embodiment is obtained by the aforementioned procedure.

When joining the clad material 3, the ceramic layer 10, and the third Al layer 16 by brazing, the temperature of each layer at the time of joining raises to around 600° C., causing heat strain in the insulating substrate 1A. However, the heat strain can be alleviated by the Ni—Ti series superelastic alloy layer 5. This in turn can prevent occurrence of defects, such as, e.g., warping, cracking, detachment, etc., of the insulating substrate 1A.

Next, a production method of a semiconductor module 35 using the insulating substrate 1A of the first embodiment as shown in FIG. 1 will be explained.

A heat dissipation member 31 is joined to the third Al layer 16 (i.e., the lower surface of the third Al layer 16) of the insulating substrate 1A by an arbitrary joining method such as brazing. Thus, a semiconductor module base 30 is obtained.

In the case of joining the heat dissipation member 31 to the third Al layer 16 of the insulating substrate 1A by brazing, the temperature of the insulating substrate 1A rises to around 600° C. at the time of joining, which causes heat strain to the insulating substrate 1A. However, the heat strain is alleviated by the Ni—Ti series superelastic alloy layer 5 of the insulating substrate 1A. This prevents occurrence of defects, such as, e.g., warping, cracking, detachment, etc., of the insulating substrate 1A.

Next, a semiconductor element 36 is joined to the surface 4a of the Ni layer 4 of the insulating substrate 1A by soldering. The solder used for soldering can be any known solder, such as, e.g., a lead-free solder, etc.

At the time of the soldering, the temperature of the insulating substrate 1A rises to around 300° C., which causes heat strain of the insulating substrate 1A. However, the heat strain is alleviated by the Ni—Ti series superealstic alloy layer 5 of the insulating substrate 1A. Therefore, the semiconductor element 36 can be joined excellently.

The semiconductor module 35 shown in FIG. 1 can be obtained by the aforementioned procedures.

In cases where the heat dissipation member 31 is made of Al or an Al alloy and that the insulating substrate 1A and the heat dissipation member 31 are joined by brazing, it is desired that an Al series brazing material (example: Al—Si series alloy brazing material) is used as a brazing material. The reasons are as follows.

The temperature conditions for brazing using an Al series brazing material (usually 590 to 610° C.) fall within the temperature range of an aging process for increasing the volume of the high-temperature stable phase having the superelastic characteristics of the NiTi superelastic alloy as the Ni—Ti series superelastic alloy. Therefore, by joining the insulating substrate 1A, the heat dissipation member 31, and the Al series brazing material by brazing, the superelastic alloy layer 5 is subjected to an aging process at the same time of joining the insulating substrate 1A and the heat dissipation member 31. As a result, the superelastic characteristics of the superealstic alloy layer 5 can assuredly develop. Furthermore, the aging process to the superelastic alloy layer 5 can be omitted and therefore, the production cost of the semiconductor module base 30 can be reduced. For the same reason, it is desired that the brazing material of the brazing layer 21 used for joining the clad material 3 and the ceramic layer 10 and the brazing material of the brazing layer 22 used for joining the ceramic layer 10 and the third Al layer 16 are Al series brazing materials.

The insulating substrate 1A and the clad material 3 of the first embodiment have the following advantages.

That is, according to the clad material 3, the Ni layer 4 and the Ti layer 6 are joined by clad rolling and the Ni—Ti series superelastic alloy layer 5 is interposed between the Ni layer 4 and the Ti layer 6. Therefore, when using the clad material 3 for the insulating substrate 1A, the thermal stress (example: heat strain) that occurs in the insulating substrate 1A due to the cooling/heating cycles is alleviated by the Ni—Ti series superelastic alloy layer 5.

If the Ni layer 4 and the Ti layer 6 are joined, not by clad rolling, but by brazing, the superelastic alloy layer 5 cannot be formed between the Ni layer 4 and the Ti layer 6.

Furthermore, since the Ni layer 4 and the first Al layer 7 are not joined in an adjoining manner, an alloy layer poor in intensity will not be formed.

Furthermore, if the Ti layer 6 and the first Al layer 7 are joined by brazing in an adjoining manner, an alloy layer poor in intensity, e.g., an Al—Ti alloy layer (Al—Ti alloy phase), is formed between the Ti layer 6 and the first Al layer 7 (that is, the bonded interface of the Ti layer 6 and the first Al layer 7) due to the heat at the time of brazing. However, in the clad material 3 of the aforementioned first embodiment, the Ti layer 6 and the first Al layer 7 are joined, not by brazing, but by clad rolling in which the layers can be joined at a temperature lower than a brazing temperature. This prevents forming of such an alloy layer poor in intensity between the Ti layer 6 and the first Al layer 7.

As mentioned above, the Ni—Ti series superelastic alloy layer 5 is interposed between the Ni layer 4 and the Ti layer 6. The Ni layer 4 and the first Al layer 7 are not joined in an adjoining manner. The Ti layer 6 and the first Al layer 7 are joined by clad rolling. These act on each other synergistically, which prevents occurrence of defects, such as, e.g., warping of the insulating substrate 1A, cracking or detachment, etc., of the bonded interface of the insulating substrate 1A. This enhances the dimensional accuracy and/or service life of the insulating substrate 1A. Furthermore, the clad material 3 includes the Ni layer 4, so the soldering joinability is excellent. Furthermore, since the clad material 3 includes the first Al layer 7, it is excellent in electrical and thermal characteristics, and the production cost can be reduced.

Furthermore, since the Ti layer 6 and the first Al layer 7 are joined by cold or warm clad rolling after joining the Ni layer 4 and the Ti layer 6 by warm or hot clad rolling, the clad material 3 has the following advantages.

That is, if the Ni layer 4 and the Ti layer 6 are joined by warm or hot clad rolling after joining the Ti layer 6 and the first Al layer 7 by cold or warm clad rolling, an alloy layer poor in intensity (example: Al—Ti alloy layer) will be formed between the Ti layer 6 and the first Al layer 7 by the heat generated at the time of joining the Ni layer 4 and the Ti layer 6. On the other hand, when the Ti layer 6 and the first Al layer 7 are joined by cold or warm clad rolling after joining the Ni layer 4 and the Ti layer 6 by warm or hot clad rolling, formation of an alloy layer poor in intensity between the Ti layer 6 and the first Al layer 7 can be assuredly prevented.

Furthermore, since the first Al layer 7 is made of Al having a purity of 99.99 mass % or higher, the first Al layer 7 can be suitably used as a wiring layer of the insulating substrate 1A.

Also, in the insulating substrate 1A, since the second metal layer 15 is the third Al layer 16 made of Al or an Al alloy, the insulating substrate 1A is excellent especially in heat dissipation characteristics, and the production cost can be further reduced.

Figure 5:
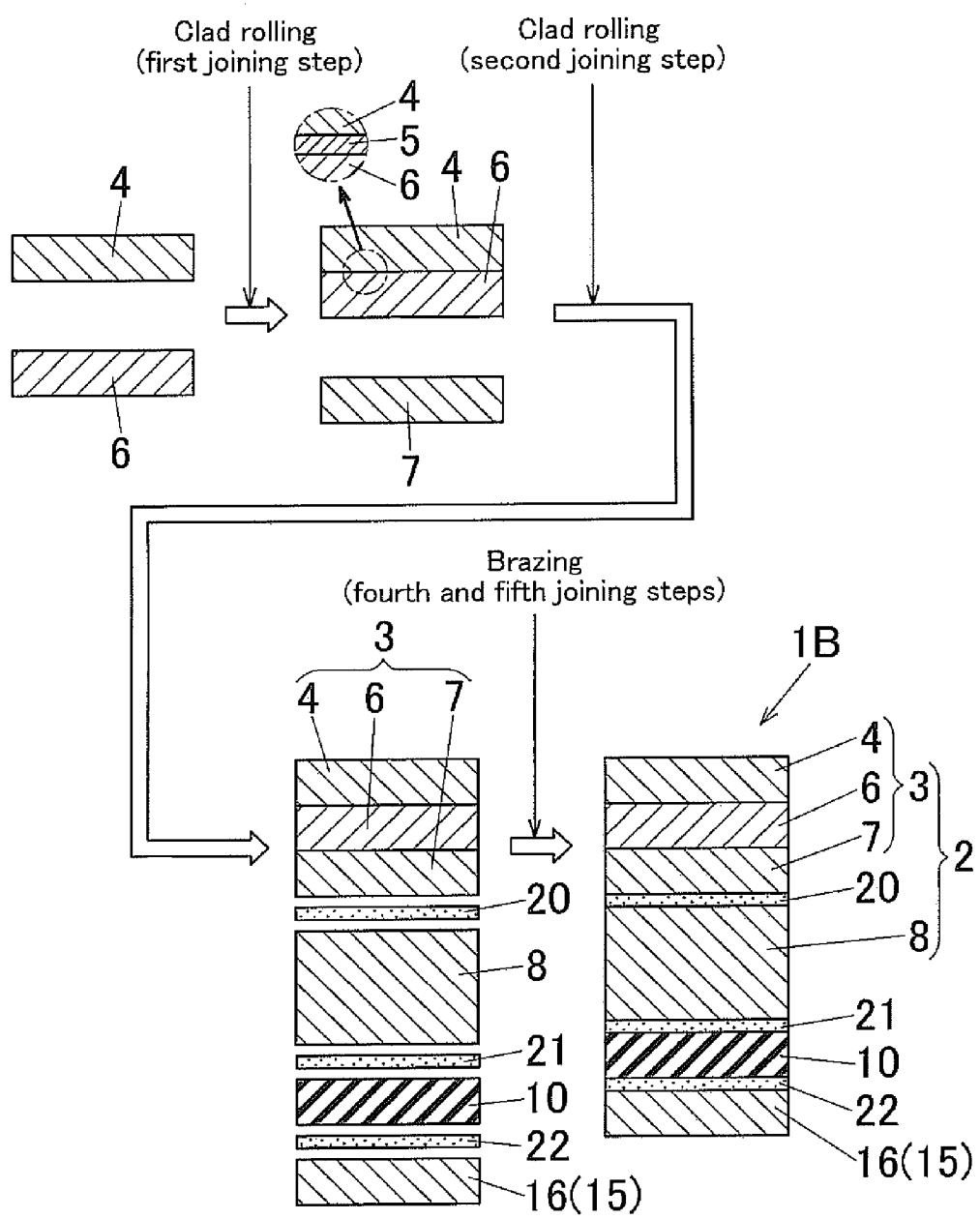
FIG. 5 is a schematic cross-sectional view showing production steps of an insulating substrate according to a second embodiment of the present invention.

FIG. 5 is an explanatory view of the insulating substrate 1B according to a second embodiment of the present invention. The insulating substrate 1B and its production method will be explained below, focusing on the differences from the first embodiment.

In the insulating substrate 1B of the second embodiment, the first metal layer 2 includes the clad material 3 of the aforementioned first embodiment and an Al layer 8 made of Al or an Al alloy. The Al layer 8 will be referred to as a "second Al layer 8" for the convenience of explanation. The second Al layer 8 is arranged on one side of the first Al layer 7 of the clad material 3 (i.e., on a lower side of the first Al layer 7 of the clad material 3) that is opposite to a side of the first Al layer 7 on which the Ti layer 6 is arranged, and is a layer provided and formed from an Al or Al alloy plate. Also, the first Al layer 7 of the clad material 3 and the second Al layer 8 are joined by brazing in an adjoining manner. In FIG. 5, the reference numeral "20" denotes a brazing layer joining the first Al layer 7 and the second Al layer 8. It is preferable that this brazing layer 20 is an Al series brazing layer. Furthermore, the second Al layer 8 and the ceramic layer 10 are joined by brazing in an adjoining manner using the brazing layer 21 as the brazing material. The brazing layer 21 is preferred to be an Al series brazing layer.

The Al purity (Al content) of the first Al layer 7 and that of the second Al layer 8 are not especially limited. However, the first Al layer 7 is preferred to be made of Al having a purity of less than 99.99 mass % or an Al alloy, especially an Al alloy of A1000 series Al alloy. The reason will be explained later. The lower limit of the Al purity (Al content) of the first Al layer 7 is preferred to be 80 mass %. The second Al layer 8 functions as a wiring layer of the insulating substrate 1B, and therefore, it is preferred to be made of Al having a purity of 99.99 mass % or higher.

The thickness of the first Al layer 7 and that of the second Al layer 8 are not especially limited. It is preferred that the second Al layer 8 is thicker than the first Al layer 7. The reason will be given later.

The other structure of the insulating substrate 1B of the second embodiment is the same as that of the insulating substrate 1A of the first embodiment.

In the production method of the insulating substrate 1B of the second embodiment, the clad material 3 is produced by the same production method as the first embodiment. In other words, in the first joining step, the Ni layer 4 and the Ti layer 6 are joined by clad rolling to thereby interpose the Ni—Ti series superelastic alloy layer 5 between the Ni layer 4 and the Ti layer 6. Thereafter, in the second joining step, the Ti layer 6 and the first Al layer 7 are joined by clad rolling. As a result, a desired clad material 3 can be obtained.

Then, in the fourth joining step of the second embodiment, the first Al layer 7 of the clad material 3 and the second Al layer 8 are joined by brazing in an adjoining manner, and the second Al layer 8 and the ceramic layer 10 are joined by brazing in an adjoining manner.

In the fifth joining step, the ceramic layer 10 and the third Al layer 16 are joined by brazing in an adjoining manner.

The order of performing the fourth joining step and the fifth joining step is not especially limited. For example, the fifth joining step can be performed after the fourth joining step. The fourth joining step can be performed after the fifth joining step. The fourth joining step and the fifth joining step can be simultaneously performed.

In the case of simultaneously performing the fourth joining step and the fifth joining step, a plate-like Al series brazing material as a brazing layer 20 is arranged between the clad material 3 (specifically, the first Al layer 7 of the clad material 3) and the second Al layer 8, a plate-like Al series brazing material as the brazing layer 21 is arranged between the second Al layer 8 and the ceramic layer 10 and further, a plate-like Al series brazing material as the brazing layer 22 is arranged between the ceramic layer 10 and the third Al layer 16. Then, the clad material 3, the second Al layer 8, the ceramic layer 10, and the third Al layer 16 are collectively and simultaneously joined by, e.g., furnace brazing.

The insulating substrate 1B of the second embodiment can be obtained by the aforementioned procedures.

The production method of the semiconductor module using the insulating substrate 1B is the same as the first embodiment.

The insulating substrate 1B and the clad material 3 of the second embodiment have the following advantages.

That is, when the first Al layer 7 is made of Al having a purity of less than 99.99 mass % or an Al alloy, this first Al layer 7 is harder than the Al layer made of Al having a purity of 99.99 mass % or higher. Therefore, the first Al layer 7 can be easily joined to the Ti layer 6 by clad rolling. Furthermore, when the second Al layer 8 is made of Al having a purity of 99.99 mass % or higher, this second Al layer 8 can be suitably used as a wiring layer of the insulating substrate 1B.

Furthermore, when the second Al layer 8 is thicker than the first Al layer 7, the second Al layer 8 can be suitably used as a wiring layer of the insulating substrate 1B and the first Al layer 7 can be reduced in thickness. Therefore, the first Al layer 7 can be more easily joined to the Ti layer 6 by clad rolling.

To assuredly obtain the aforementioned advantages, it is especially preferable that the thickness of the first Al layer 7 is set to fall within the range of 10 to 100 μm and that the thickness of the second Al layer 8 is set to fall within the range of 300 to 600 μm.

Figure 6:
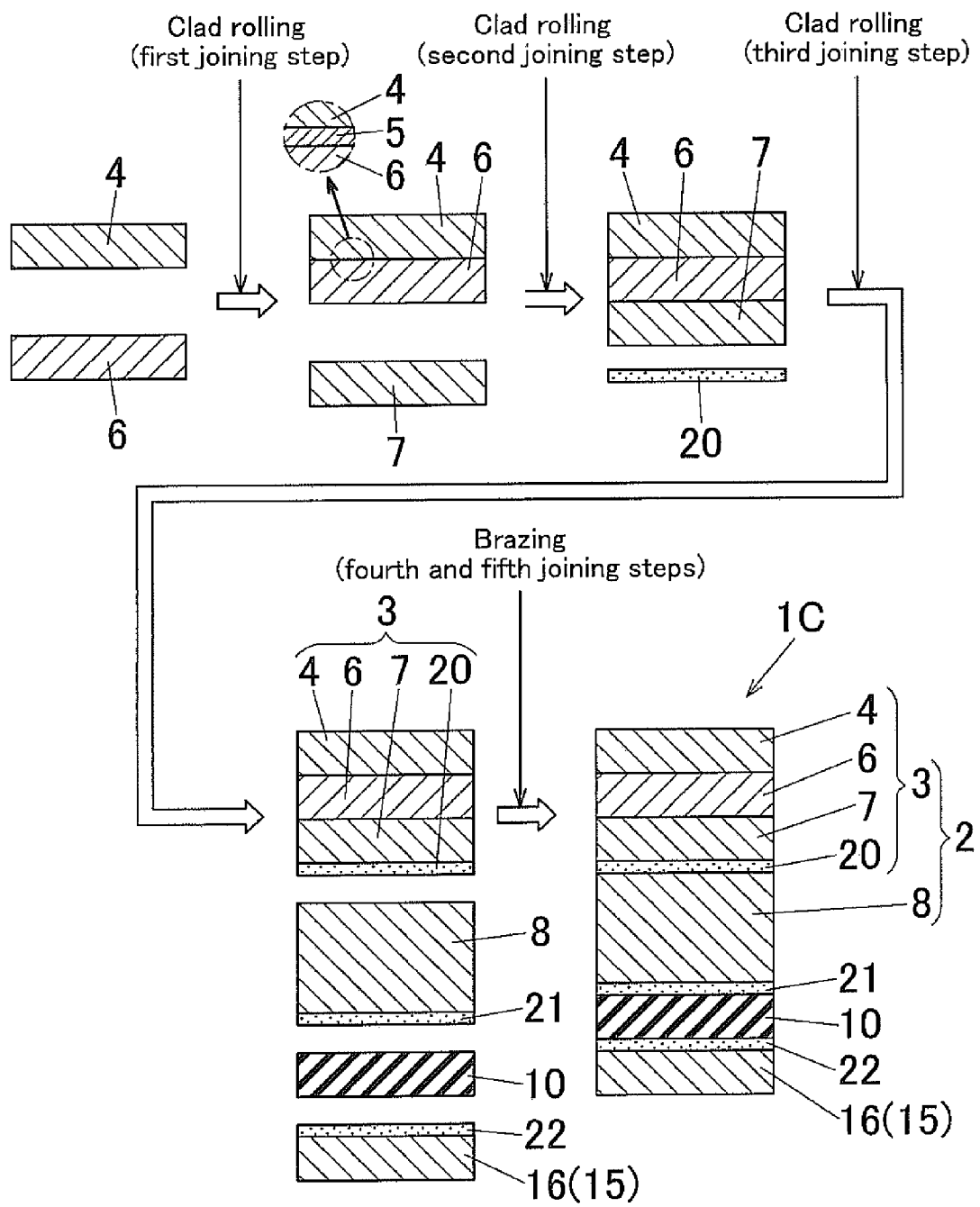
FIG. 6 is a schematic cross-sectional view showing production steps of an insulating substrate according to a third embodiment of the present invention.

FIG. 6 is an explanatory drawing of an insulating substrate 1C according to a third embodiment of the present invention. This insulating substrate 1C and its production method will be explained below, focusing on the differences from the second embodiment.

In the insulating substrate 1C of the third embodiment, the first metal layer 2 includes the clad material 3 and the second Al layer 8 made of Al or an Al alloy.

The clad material 3 includes a Ni layer 4, a Ti layer 6, a first Al layer 7, and a brazing layer 20. The Ni layer 4, the Ti layer 6, and the first Al layer 7 are integrally joined in a laminated manner by the same procedures as the aforementioned first embodiment. The brazing layer 20 is arranged on one side (i.e., lower side) of the first Al layer 7 that is opposite to a side of the first Al layer 7 on which the Ti layer 6 is arranged. The brazing layer 20 is preferred to be a layer made of an Al series brazing material (example: Al—Si series alloy brazing material). Furthermore, the brazing layer 20 is a layer made of a plate-like brazing material. The first Al layer 7 and the brazing layer 20 are joined by clad rolling in an adjoining manner. The thickness of the brazing layer 20 can be, e.g., 10 to 60 μm.

Furthermore, the first Al layer 7 of the clad material 3 and the second Al layer 8 are joined by brazing in an adjoining manner using the brazing layer 20 as a brazing material.

The other structure of the insulating substrate 1C of the third embodiment is the same as the insulating substrate 1B of the second embodiment.

Next, the production method of the insulating substrate 1C of the third embodiment will be explained.

First, the clad material 3 of the aforementioned first embodiment is produced. That is, in the first joining step, the Ni layer 4 and the Ti layer 6 are joined by clad rolling to thereby interpose a Ni—Ti series superelastic alloy layer 5 between the Ni layer 4 and the Ti layer 6. Thereafter, in the second joining step, the Ti layer 6 and the first Al layer 7 are joined by clad rolling.

Next, the first Al layer 7 and the brazing layer 20 are joined by clad rolling in an adjoining manner. This process will be referred to as a "third joining step" for the convenience of explanation. As a result, a desired clad material 3 can be obtained.

In the present invention, the third joining step and the second joining step can be performed simultaneously. Furthermore, a joined body in which the Ni layer 4 and the Ti layer 6 are joined by clad rolling and a joined body in which the first Al layer 7 and the brazing layer 20 are joined by clad rolling can be joined by clad rolling in a manner such that the Ti layer 6 and the first Al layer 7 are adjoined.

The joining condition of the third joining step is not especially limited, and can be any conditions in which the first Al layer 7 and the brazing layer 20 can be joined by clad rolling. For example, the joining conditions can be a clad temperature of 350 to 430° C. and a cladding rate of 30 to 60%.

Also, the second Al layer 8 and the brazing layer 21 are joined by clad rolling in an adjoining manner. The joining conditions in this case are not especially limited, and can be any conditions in which the second Al layer 8 and the brazing layer 21 can be joined by clad rolling. For example, the joining conditions can be a clad temperature of 350 to 430° C. and a cladding rate of 30 to 60%.

The third Al layer 16 and the brazing layer 22 are joined by clad rolling in an adjoining manner. The joining conditions in this instance are not especially limited, and can be any conditions in which the third Al layer 16 and the brazing layer 22 can be joined by clad rolling. For example, the joining conditions can be a clad temperature of 350 to 430° C. and a cladding rate of 30 to 60%.

In the fourth joining step of the third embodiment, the first Al layer 7 of the clad material 3 and the second Al layer 8 are joined by brazing in an adjoining manner using the brazing layer 20 of the clad material 3 as a brazing material. Further, the second Al layer 8 and the ceramic layer 10 are joined by brazing in an adjoining manner using the brazing layer 21 joined to the second Al layer 8 as a brazing material.

In the fifth joining step, the ceramic layer 10 and the third Al layer 16 are joined by brazing in an adjoining manner using the brazing layer 22 joined to the third Al layer 16 as a brazing material.

The order of performing the fourth joining step and the fifth joining step is not especially limited. For example, the fifth joining step can be performed after the fourth joining step. The fourth joining step can be performed after the fifth joining step. The fourth joining step and the fifth joining step can be simultaneously performed.

In the case of performing the fourth joining step and the fifth joining step simultaneously, the clad material 3, the second Al layer 8, the ceramic layer 10, and the third Al layer 16 are collectively and simultaneously joined by, e.g., furnace brazing using each brazing layer 20, 21 and 22 as the brazing material.

The insulating substrate 1C of the third embodiment can be obtained by the aforementioned procedures.

The production method of the semiconductor module using the insulating substrate 1C is the same as the aforementioned first embodiment.

The insulating substrate 1C and the clad material 3 of the third embodiment have the following advantages.

That is, in the clad material 3, since the first Al layer 7 and the brazing layer 20 are joined by clad rolling, the brazing layer 20 can be used as a brazing material for joining the clad material 3 and another layers of the insulating substrate 1C (e.g., the second Al layer 8 or the ceramic layer 10) at the time of brazing them. Therefore, there is no need to separately prepare a brazing material when joining the clad material 3 and another layers of the insulating substrate 1C, which enables an easy joining operation.

While illustrative embodiments of the present invention have been described herein, the present invention is not limited to the embodiments described herein, but includes various changes that fall within the scope that does not deviate from the spirits of the invention.

Also, the present invention can be structured by combining two or more technical concepts of the aforementioned first to third embodiments.

In the aforementioned embodiment, the second metal layer 15 is constituted by one layer (that is, the third Al layer 16). In the present invention, the second metal layer 15 can be constituted by a plurality of metal layers arranged in a laminated manner.

EXAMPLES

Next, specific Examples of the present invention will be explained. It should be noted, however, that the present invention is not specifically limited to these Examples.

Example 1

In Example 1, the insulating substrate 1A of the aforementioned first embodiment shown in FIGS. 2 and 3 was produced. The production method was as follows.

The following plates were prepared as a Ni layer 4, a Ti layer 6, a first Al layer 7, a ceramic layer 10, and a third Al layer 16.

Ni layer 4: a pure Ni plate having a length of 25 mm, a width of 25 mm, and a thickness of 50 μm Ti layer 6: a pure Ti plate having a length 25 mm, a width of 25 mm, and a thickness of 200 μm First Al layer 7: a pure Al plate having a length of 25 mm, a width of 25 mm, and a thickness of 600 μm Ceramic layer 10: an AlN plate having a length of 25 mm, a width of 25 mm, and a thickness of 600 μm Third Al layer 16: a pure Al plate having a length 25 mm, a width of 25 mm, and a thickness of 600 μm The purity of the Ni plate forming the Ni layer 4 was JIS (Japanese Industrial Standards) type 1. The purity of the Ti plate forming the Ti layer 6 was JIS type 1. The purity of the Al plate forming the first Al layer 7 was 4 N (i.e., 99.99 mass %). The purity of the Al plate forming the third Al layer 16 was 4 N.

Then, in the first joining step, the Ni layer 4 and the Ti layer 6 were joined by warm or hot clad rolling to thereby form the NiTi superelastic alloy layer 5 as a Ni—Ti series superelastic alloy layer between the Ni layer 4 and the Ti layer 6. Next, in the second joining step, the Ti layer 6 and the first Al layer 7 were joined by cold or warm clad rolling. Thus, the clad material 3 was obtained (thickness: about 850 μm). Then, the clad material 3 and the third Al layer 16 were washed by acetone as an organic cleaning fluid.

Next, in the fourth joining step and the fifth joining step, a plate-like Al series brazing material (thickness: 15 μm) was arranged between the clad material 3 and the ceramic layer 10 as the brazing layer 21, and a plate-like Al series brazing material (thickness: 15 μm) was arranged between the ceramic layer 10 and the third Al layer 16 as the brazing layer 22. Then, the clad material 3, the ceramic layer 10, and the third Al layer 16 were collectively and simultaneously joined by furnace brazing. The joining conditions applied to the joining by brazing were: 6 gf/cm² of applied load; heating temperature of 600° C.; and 15 min of retention time. As each plate-like Al series brazing material, a plate-like Al—Si:10 mass % alloy material was used.

The insulating substrate 1A was obtained by the aforementioned procedures. In the insulating substrate 1A, the thickness of the NiTi superelastic alloy layer 5 formed between the Ni layer 4 and the Ti layer 6 was about 1 μm.

Next, a cooling/heating cycle testing of −40 to 125° C. was repeatedly performed 1,000 times for the insulating substrate 1A. When each bonded interface of the insulating substrate 1A was examined for cracks and detachments using an ultrasonic testing device, there were no cracks or detachments. Furthermore, the warping of the surface 4a of the Ni layer 4 of the insulating substrate 1A was measured using a laser shape measuring instrument. It was found that warping had hardly occurred.

Example 2

In the Example 2, the insulating substrate 1B of the aforementioned second embodiment as shown in FIG. 5 was produced. The production method was as follows.

The following plates were prepared as a Ni layer 4, a Ti layer 6, a first Al layer 7, a second Al layer 8, a ceramic layer 10, and a third Al layer 16.

Ni layer 4: a pure Ni plate having a length of 25 mm, a width of 25 mm, a thickness of 20 μm Ti layer 6: a pure Ti plate having a length of 25 mm, a width of 25 mm, and a thickness 20 μm First Al layer 7: a pure Al plate having a length of 25 mm, a width of 25 mm, and a thickness 40 μm Second Al layer 8: a pure Al plate having a length of 25 mm, a width of 25 mm, and a thickness 600 μm Ceramic layer 10: an AlN plate having a length of 25 mm, a width of 25 mm, and a thickness of 600 μm Third Al layer 16: a pure Al plate having a length of 25 mm, a width of 25 mm, and thickness of 600 μm The purity of the Ni plate forming the Ni layer 4 was JIS type 1. The purity of the Ti plate forming the Ti layer 6 was JIS type 1. The purity of the Al plate forming the first Al layer 7 was 4 N (i.e., 99.99 mass %). The purity of the Al plate forming the second Al layer 8 was 4 N. The purity of the Al plate forming the third Al layer 16 was 4 N.

Then, in the first joining step, the Ni layer 4 and the Ti layer 6 were joined by warm or hot clad rolling to thereby form the NiTi superelastic alloy layer 5 as a Ni—Ti series superelastic alloy layer between the Ni layer 4 and the Ti layer 6. Next, in the second joining step, the Ti layer 6 and the first Al layer 7 were joined by cold or warm clad rolling. Thus, the clad material 3 was obtained (thickness: about 80 μm). Then, the clad material 3, the second Al layer 8 and the third Al layer 16 were washed by acetone as an organic cleaning fluid.

Next, in the fourth joining step and the fifth joining step, a plate-like Al series brazing material (thickness: 15 μm) was arranged between the clad material 3 and the second Al layer 8 as the brazing layer 20. A plate-like Al series brazing material (thickness: 15 μm) was arranged between the second Al layer 8 and the ceramic layer 10 as the brazing layer 21. A plate-like Al series brazing material (thickness: 15 μm) was arranged between the ceramic layer 10 and the third Al layer 16 as the brazing layer 22. Then, the clad material 3, the second Al layer 8, the ceramic layer 10 and the third Al layer 16 were collectively and simultaneously joined by furnace brazing. The joining conditions applied to the joining by brazing were: 6 gf/cm$^2$ of applied load; heating temperature of 600° C.; and 15 min of retention time. Also, as each plate-like Al series brazing material, a plate-like Al—Si:10 mass % alloy brazing material was used.

The insulating substrate 1B was obtained by the aforementioned procedures. In the insulating substrate 1B, the thickness of the NiTi superelastic alloy layer 5 formed between the Ni layer 4 and the Ti layer 6 was about 1 μm.

Next, a cooling/heating cycle testing of −40 to 125° C. was repeatedly performed 1,000 times for the insulating substrate 1B. Each bonded interface of the insulating substrate 1B was examined for cracks and detachments using an ultrasonic testing device. It was found that there were no cracks or detachments. Furthermore, the warping of the surface 4a of the Ni layer 4 of the insulating substrate 1B was measured using a laser shape measuring instrument. It was found that warping had hardly occurred.

Example 3

In the Example 3, the insulating substrate 1B of the aforementioned second embodiment as shown in FIG. 5 was produced in the same manner as Example 2. The production method was as follows.

The following plates were prepared as a Ni layer 4, a Ti layer 6, a first Al layer 7, a second Al layer 8, a ceramic layer 10, and a third Al layer 16.

Ni layer 4: a pure Ni plate having a length of 25 mm, a width of 25 mm, and a thickness of 15 μm Ti layer 6: a pure Ti having a length of 25 mm, a width of 25 mm, and a thickness of 15 μm First Al layer 7: an Al plate having a length of 25 mm, a width of 25 mm, and a thickness of 100 μm Second Al layer 8: a pure Al plate having a length of 25 mm, a width of 25 mm, and a thickness 600 μm Ceramic layer 10: an AlN plate having a length of 25 mm, a width of 25 mm, and a thickness of 600 μm Third Al layer 16: a pure Al plate having a length of 25 mm, a width of 25 mm, and a thickness of 600 μm The purity of the Ni plate forming the Ni layer 4 was JIS type 1. The purity of the Ti plate forming the Ti layer 6 was JIS type 1. The purity of the Al plate forming the first Al layer 7 was 2 N (i.e., 99 mass %). The purity of the Al plate forming the second Al layer 8 was 4 N. The purity of the Al plate forming the third Al layer 16 was 4 N.

Then, in the first joining step, the Ni layer 4 and the Ti layer 6 were joined by warm or hot clad rolling to thereby form the NiTi superelastic alloy layer 5 as a Ni—Ti series superelastic alloy layer between the Ni layer 4 and the Ti layer 6. Next, in the second joining step, the Ti layer 6 and the first Al layer 7 were joined by cold or warm clad rolling. Thus, the clad material 3 was obtained (thickness: about 130 μm). Then, the clad material 3, the second Al layer 8 and the third Al layer 16 were washed by acetone as an organic cleaning fluid.

Next, in the fourth joining step and the fifth joining step, a plate-like Al series brazing material (thickness: 15 μm) was arranged between the clad material 3 and the second Al layer 8 as the brazing layer 20. A plate-like Al series brazing material (thickness: 15 μm) was arranged between the second Al layer 8 and the ceramic layer 10 as the brazing layer 21. A plate-like Al series brazing material (thickness: 15 μm) was arranged between the ceramic layer 10 and the third Al layer 16 as the brazing layer 22. Then, the clad material 3, the second Al layer 8, the ceramic layer 10 and the third Al layer 16 were collectively and simultaneously joined by furnace brazing. The joining conditions for the joining by brazing were: 6 gf/cm$^2$ of applied load; heating temperature of 600° C.; and 15 min of retention time. Also, as each plate-like Al series brazing material, a plate-like Al—Si:10 mass % alloy brazing material was used.

The insulating substrate 1C was obtained by the aforementioned procedures. In the insulating substrate 1C, the thickness of the NiTi superelastic alloy layer 5 formed between the Ni layer 4 and the Ti layer 6 was about 1 μm.

Next, a cooling/heating testing of −40 to 125° C. was repeatedly performed 1,000 times for the insulating substrate 1B. Each bonded interface of the insulating substrate 1B was examined for cracks and detachments using an ultrasonic testing device. It was found that there were no cracks or detachments. Furthermore, the warping of the surface 4a of the Ni layer 4 of the insulating substrate 1B was measured using a laser shape measuring instrument. It was found that warping had hardly occurred.

Example 4

In the Example 4, the insulating substrate 1C of the aforementioned third embodiment as shown in FIG. 6 was produced. The production method was as follows.

The following plates were prepared as a Ni layer 4, a Ti layer 6, a first Al layer 7, a second Al layer 8, a ceramic layer 10, and a third Al layer 16.

Ni layer 4: a pure Ni plate having a length of 25 mm, a width of 25 mm, and a thickness of 20 μm pure Ti layer 6: a pure Ti plate having a length of 25 mm, a width of 25 mm, and a thickness of 20 μm pure First Al layer 7: a pure Al plate having a length of 25 mm, a width of 25 mm, and a thickness of 40 μm Second Al layer 8: a pure Al plate having a length of 25 mm, a width of 25 mm, and a thickness of 600 μm Ceramic layer 10: an AlN plate having a length of 25 mm, a width of 25 mm, and a thickness of 600 μm Third Al layer 16: a pure Al plate having a length of 25 mm, a width of 25 mm, and a thickness of 600 μm The purity of the Ni plate forming the Ni layer 4 was JIS type 1. The purity of the Ti plate forming the Ti layer 6 was JIS type 1. The purity of the Al plate forming the first Al layer 7 was 4 N (i.e., 99.99 mass %). The purity of the Al plate forming the second Al layer 8 was 4 N. The purity of the Al plate forming the third Al layer 16 was 4 N.

Then, in the first joining step, the Ni layer 4 and the Ti layer 6 were joined by warm or hot clad rolling to thereby form the NiTi superelastic alloy layer 5 as a Ni—Ti series superelastic alloy layer between the Ni layer 4 and the Ti layer 6. Next, in the second joining step, the Ti layer 6 and the first Al layer 7 were joined by cold or warm clad rolling. Next, in the third joining step, the first Al layer 7 and the plate-like Al series brazing material (thickness: 15 μm) as a brazing layer 20 were joined by clad rolling. As a plate-like Al series brazing material, a plate-like Al—Si:10 mass % alloy brazing material was used. Thus, the clad material 3 was obtained (thickness: about 95 μm). Then, the clad material 3 was washed by acetone as an organic cleaning fluid.

Also, the second Al layer 8 and a plate-like Al series brazing material (thickness: 15 μm) as a brazing layer 21 were joined by clad rolling. As a plate-like Al series brazing material, a plate-like Al—Si:10 mass % alloy brazing material was used. The joined boy obtained in this way was washed by acetone.

Also, the third Al layer 16 and a plate-like Al series brazing material (thickness: 15 μm) as a brazing layer 22 were joined by clad rolling. As a plate-like Al series brazing material, a plate-like Al—Si:10 mass % alloy brazing material was used. The joined body obtained in this way was washed by acetone.

Next, in the fourth joining step and the fifth joining step, the clad material 3, the second Al layer 8, the ceramic layer 10 and the third Al layer 16 were collectively and simultaneously joined by furnace brazing using each brazing layer 20, 21, and 22. The joining conditions for the joining by brazing was: 6 gf/cm$^2$ of applied load; heating temperature of 600° C.; and 15 min of retention time.

The insulating substrate 1C was obtained by the aforementioned procedures. In the insulating substrate 1C, the thickness of the NiTi superelastic alloy layer 5 formed between the Ni layer 4 and the Ti layer 6 was about 1 μm.

Next, a cooling/heating cycle testing of −40 to 125° C. was repeatedly performed 1,000 times for the insulating substrate 1C. Each bonded interface of the insulating substrate 1C was examined for cracks and detachments using an ultrasonic testing device. It was found that there were no cracks or detachments. Furthermore, the warping of the surface of the Ni layer of the insulating substrate 1C was measured using a laser shape measuring instrument. It was found that warping had hardly occurred.

Comparative Example 1

Figure 7:
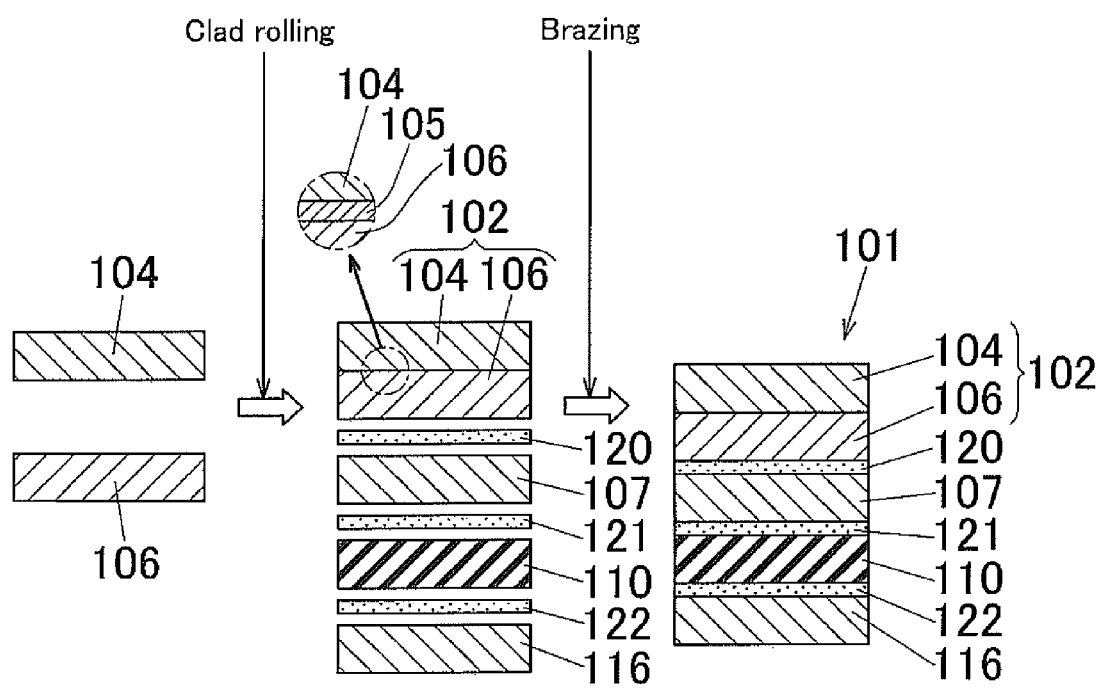
FIG. 7 is a schematic cross-sectional view showing production steps of an insulating substrate according to Comparative Example 1.

In the Comparative Example 1, the insulating substrate 101 of the as shown in FIG. 7 was produced. The production method was as follows.

The following plates were prepared as a Ni layer 104, a Ti layer 106, a first Al layer 107, a ceramic layer 110, and a third Al layer 116.

Ni layer 104: a pure Ni plate having a length of 25 mm, a width of 25 mm, and a thickness of 50 μm Ti layer 106: a pure Ti plate having a length of 25 mm, a width of 25 mm, a thickness of 50 μm First Al layer 107: a pure Al plate having a length of 25 mm, a width of 25 mm, and a thickness of 600 μm Ceramic layer 110: an AlN plate having a length of 25 mm, a width of 25 mm, a thickness of 600 μm Third Al layer 116: a pure Al plate having a length of 25 mm, a width of 25 mm, a thickness of 600 μm The purity of the Ni plate forming the Ni layer 104 was JIS type 1. The purity of the Ti plate forming the Ti layer 106 was JIS type 1. The purity of the Al plate forming the first Al layer 107 was 4 N (i.e., 99.99 mass %). The purity of the Al plate forming the third Al layer 116 was 4 N.

Then, the Ni layer 104 and the Ti layer 106 were joined by clad rolling to thereby form the NiTi superelastic alloy layer 105 as a Ni—Ti series superelastic alloy layer between the Ni layer 104 and the Ti layer 106. The clad material 102 was obtained in this way.

Next, a plate-like Al series brazing material (thickness: 15 μm) as a brazing layer 120 was arranged between the clad material 102 and the first Al layer 107, a plate-like Al series brazing material (thickness: 15 μm) as a brazing layer 121 was arranged between the first Al layer 107 and the ceramic layer 110, and a plate-like Al series brazing material (thickness: 15 μm) as a brazing layer 122 was arranged between the ceramic layer 110 and the third Al layer 116. Then, the clad material 102, the first Al layer 107, the ceramic layer 110 and the third Al layer 116 were collectively and simultaneously joined by furnace brazing. As each plate-like Al series brazing material, a plate-like Al—Si:10 mass % alloy brazing material was used.

The insulating substrate 101 was obtained by the aforementioned procedures. In the insulating substrate 101, even though no cooling/heating cycle testing was conducted for the insulating substrate 101, there were cracks formed on the weak Al—Ti alloy layer (Al—Ti alloy phase) formed on the bonded interface of the Ti layer 106 and the first Al layer 107. The Al—Ti alloy layer was formed at the time of furnace brazing, and the cracking occurred at the time of furnace brazing.

The present invention claims priority to Japanese Patent Application No. 2010-249561 filed on Nov. 8, 2010, the entire disclosure of which is incorporated herein by reference in its entirety.

The terms and descriptions used herein are used only for explanatory purposes and the present invention is not limited to them. The present invention allows various design-changes falling within the claimed scope of the present invention unless it deviates from the spirits of the invention.

While the present invention may be embodied in many different forms, a number of illustrative embodiments are described herein with the understanding that the present disclosure is to be considered as providing examples of the principles of the invention and such examples are not intended to limit the invention to preferred embodiments described herein and/or illustrated herein.

While illustrative embodiments of the invention have been described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure and during the prosecution of this case, the following abbreviated terminology may be employed: "e.g." which means "for example;" and "NB" which means "note well."

INDUSTRIAL APPLICABILITY

The present invention can be used as a clad material for insulating substrates, its production method, a semiconductor module base, and a semiconductor module.

DESCRIPTION OF THE REFERENCE NUMERALS 1A, 1B, 1C: insulating substrate
2: first metal layer
3: clad material
4: Ni layer
5: Ni—Ti series superelastic alloy layer (NiTi superelastic alloy layer)
6: Ti layer
7: first Al layer
8: second Al layer
10: ceramic layer
15: second metal layer
16: third Al layer
20, 21, 22: brazing layer
30: semiconductor module base
35: semiconductor module
36: semiconductor element
40: clad rolling mill

The invention claimed is:

1. A clad material for insulating substrates, comprising:
a Ni layer made of Ni or a Ni alloy, the Ni layer having a surface on which a semiconductor element is to be joined;
a Ti layer made of Ti or a Ti alloy and arranged on one side of the Ni layer, the Ti layer and the Ni layer being joined by clad rolling;
a Ni—Ti series superelastic alloy layer interposed between the Ni layer and the Ti layer, the Ni—Ti series superelastic alloy layer being formed by alloying at least Ni of constituent elements of the Ni layer and at least Ti of constituent elements of the Ti layer; and
a first Al layer made of Al or an Al alloy and arranged on one side of the Ti layer that is opposite to a side of the Ti layer on which the Ni layer is arranged, and the first Al layer and the Ti layer being joined by clad rolling in an adjoining manner.

2. The clad material for insulating substrate as recited in claim 1,
wherein the Ti layer and the first Al layer are joined by cold or warm clad rolling after joining the Ni layer and the Ti layer by warm or hot clad rolling.

3. The clad material for insulating substrates as recited in claim 1,
wherein the first Al layer and a brazing layer arranged on one side of the first Al layer that is opposite to a side of the first Al layer on which the Ti layer is arranged are joined by clad rolling.

4. The clad material for insulating substrates as recited in claim 1,
wherein the first Al layer is made of Al having a purity of 99.99 mass % or higher.

5. An insulating substrate comprising:
a ceramic layer;
a first metal layer arranged on one side of the ceramic layer; and
a second metal layer arranged on the other side of the ceramic layer that is opposite to the one side of the ceramic layer on which the first metal layer is arranged,
wherein the first metal layer and the ceramic layer are joined,
wherein the ceramic layer and the second metal layer are joined, and
wherein the first metal layer contains the clad material as recited in claim 1.

6. The insulating substrate as recited in claim 5,
wherein the first Al layer of the clad material is made of Al having a purity of 99.99 mass % or higher, and
wherein the first Al layer and the ceramic layer are joined by brazing in an adjoining manner.

7. The insulating substrate as recited in claim 5,
wherein the first metal layer further comprises a second Al layer made of Al or an Al alloy,
wherein the first Al layer of the clad material and the second Al layer are joined by brazing in an adjoining manner, and
wherein the second Al layer and the ceramic layer are joined by brazing in an adjoining manner.

8. The insulating substrate as recited in claim 7,
wherein the first Al layer is made of Al having a purity of less than 99.99 mass % or an Al alloy, and
wherein the second Al layer is made of Al having a purity of 99.99 mass % or higher.

9. The insulating substrate as recited in claim 8,
wherein the second Al layer is thicker than the first Al layer.

10. The insulating substrate as recited in claim 5,
wherein the second metal layer includes a third Al layer made of Al or an Al alloy, and
wherein the ceramic layer and the third Al layer are joined by brazing.

11. A production method of an insulating substrate including a ceramic layer, a first metal layer arranged on one side of the ceramic layer, and a second metal layer arranged on the other side of the ceramic layer that is opposite to the one side of the ceramic layer on which the first metal layer is arranged, the production method comprising:
a fourth joining step of joining the first metal layer and the ceramic layer; and
a fifth joining step of joining the ceramic layer and the second metal layer,
wherein the first metal layer includes the clad material as recited in claim 1.

12. The production method of an insulating substrate as recited in claim 11,
wherein the first Al layer of the clad material of the first metal layer is made of Al having a purity of 99.99 mass % or higher, and
wherein in the fourth joining step, the first Al layer and the ceramic layer are joined by brazing in an adjoining manner.

13. The production method of an insulating substrate as recited in claim 11,
wherein the first metal layer further includes a second Al layer made of Al or an Al alloy, and
wherein in the fourth joining step, the first Al layer of the clad material and the second Al layer are joined by brazing in an adjoining manner, and the second Al layer and the ceramic layer are joined by brazing in an adjoining manner.

14. The production method of an insulating substrate as recited in claim 13,
wherein the first Al layer is made of Al having a purity of less than 99.99 mass % or an Al alloy, and
wherein the second Al layer is made of Al having a purity of 99.99 mass % or higher.

15. The production method of an insulating substrate as recited in claim 14,
wherein the second Al layer is thicker than the first Al layer.

16. The production method of an insulating substrate as recited in claim 11,
wherein the second metal layer contains a third Al layer made of Al or an Al alloy, and
wherein the ceramic layer and the third Al layer are joined by brazing.

17. A base for a semiconductor module, comprising:
the insulating substrate as recited in claim 5; and
a heat dissipation member arranged on one side of the insulating substrate which is opposite to a side of the second metal layer of the insulating substrate on which the ceramic layer is arranged,
wherein the second metal layer and the heat dissipation member are joined.

18. A semiconductor module comprising:
the insulating substrate as recited in claim 5;
a heat dissipation member arranged on one side of the insulating substrate that is opposite to a side of the second metal layer of the insulating substrate on which the ceramic layer is arranged; and
a semiconductor element,
wherein the semiconductor element is joined to a surface of the Ni layer of the insulating substrate by soldering, and
wherein the second metal layer and the heat dissipation member are joined.

* * * * *